(12) United States Patent
Horio

(10) Patent No.: US 6,368,957 B1
(45) Date of Patent: Apr. 9, 2002

(54) SEMICONDUCTOR DEVICE AND METHOD FOR MANUFACTURING SEMICONDUCTOR DEVICE

(75) Inventor: Takuji Horio, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/292,666

(22) Filed: Apr. 16, 1999

(30) Foreign Application Priority Data

Oct. 5, 1998 (JP) ........................................... 10-282371

(51) Int. Cl.⁷ .......................................... H01L 21/4763
(52) U.S. Cl. ...................... 438/634; 438/675; 438/698; 438/714; 216/18; 216/20; 216/34
(58) Field of Search ................................ 438/634, 675, 438/698, 714, 724; 216/18, 20, 34; 427/574, 569

(56) References Cited

U.S. PATENT DOCUMENTS

| | | | | |
|---|---|---|---|---|
| 5,213,840 A | * | 5/1993 | Retallick et al. | 427/97 |
| 5,837,155 A | * | 11/1998 | Inagaki et al. | 216/18 |
| 6,017,794 A | * | 1/2000 | Burns et al. | 438/258 |
| 6,025,652 A | * | 2/2000 | Tsukamoto | 257/797 |
| 6,093,597 A | * | 7/2000 | Hayashi | 438/238 |
| 6,093,943 A | * | 7/2000 | Ikemasu | 257/306 |

* cited by examiner

Primary Examiner—David Nelms
Assistant Examiner—Renee' R. Berry
(74) Attorney, Agent, or Firm—Volentine Francos, PLLC

(57) ABSTRACT

In the method for manufacturing a semiconductor device according to the present invention, after forming a BPSG film 110 on a silicon substrate 100, a preparatory hole 120 that reaches a specific depth and has a larger diameter than a contact hole 118 is formed at a position where the contact hole 118 (see FIG. 4) is to be formed at the BPSG film 110. Thus, polysilicon side walls 114 (see FIG. 4) formed at side portions of a polysilicon film 112 (see FIG. 4) are also formed at the side walls of the preparatory hole 120. As a result, the contact hole 118 (see FIG. 4) free of shape defects can be formed by using an etching mask 116 (see FIG. 4) constituted of the polysilicon film 112 and the polysilicon side walls 114. This structure prevents defects related to the shape of the hole and reduces electrical defects such as shorting.

12 Claims, 8 Drawing Sheets

SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device and a method for manufacturing a semiconductor device.

2. Description of the Background Art

In response to the need for miniaturization and higher integration of semiconductor devices, great progress has been made in semiconductor micro-machining technology in recent years. This, in turn, has resulted in practical semiconductor devices having a multi-layer structure achieved by sequentially laminating a plurality of substrates upon which electrical elements are formed alternately with insulating layers. In such a semiconductor device having a multilayer structure, power is normally supplied to the individual electrical elements via through holes which are referred to as contact hole formed at the insulating layers. The contact hole is formed through etching and for this purpose an etching mask is formed through patterning on the front surface of a roughly planar insulating layer in the prior art.

In addition, when forming a pattern for contact holes that are too small to be formed through normal photolithography/etching processes, a method is adopted in which the side walls around the contact hole and areas other than the side walls are formed of polysilicon through separate steps to achieve an etching mask for contact hole formation in the prior art. This method in the prior art facilitates control of the bore diameter of the contact hole, which is achieved by varying the film thickness at the side walls only.

Furthermore, the method of the prior art described above, which uses an etching mask constituted of polysilicon, achieves an advantage in that the film thickness of the mask can be adjusted without affecting the resolution. In contrast, a conventional photoresist mask, which necessitates that the thickness of the photoresist be set to a large value to open deep contact hole since the selection ratio relative to the photoresist (the etching rate ratio of the photoresist/polysilicon) cannot be set large enough, presents problems such as a reduction in resolution occurring during the photolithography step due to the increase in the film thickness.

However, the method for manufacturing a semiconductor device in the prior art described above poses the following problems as the degree of integration and the film thickness of the insulating layers increase.

(1) Tapering of the contact hole shape caused by receding polysilicon side walls.

When the film thickness of an insulating layer increases, it naturally results in an increase in the length of time required for etching to form contact hole. In such a case, the polysilicon side wall portions are caused to recede by the etching process to increase the diameter at the upper portion of the contact hole. Consequently, the shape of the contact hole upper portion becomes tapered. If a wiring layer is present in the vicinity of a contact hole under these circumstances, the margin between the patterns is reduced by the increase in the diameter of the contact hole, and when the wiring layer to be connected to the contact hole is formed in a subsequent step, a shorting defect may occur between the wiring layer and the electrode provided at the contact hole.

(2) Shape defects caused by a higher aspect ratio.

While it is necessary to set the film thickness of the polysilicon pattern at a large value in order to avoid problems that would otherwise occur due to the tapering of the contact hole upper portion, the larger film thickness tends to induce phenomena such as bowing, whereby the diameter of the contact hole is caused to become larger in the middle and stoppage of the etching process at the middle portions of the contact hole due to the higher aspect ratio. In order to solve these problems, a high-density, low-pressure plasma must be generated, which necessitates installation of an expensive apparatus.

SUMMARY OF THE INVENTION

An object of the present invention, which has been completed by addressing the problems of the method for manufacturing a semiconductor device in the prior art discussed above, is to provide a new and improved semiconductor device and method for manufacturing a semiconductor device, through which shape defects at holes such as contact holes formed at an insulating layer can be prevented to reduce electrical defects such as shorting.

In order to achieve the object described above in a first aspect of the present invention, a method for manufacturing a semiconductor device that includes a hole formation process in which a hole is formed at an insulating layer laminated on a semiconductor substrate with the hole formation process comprising a step in which a preparatory hole having a diameter larger than the diameter of a hole that will reach a specific depth in the insulating layer is formed at a predetermined position at the insulating layer, a step in which a hole upper portion is formed by forming a protective wall having a specific thickness at the inner wall of the preparatory hole and a step in which a hole lower portion having a smaller diameter than the preparatory hole is formed at the bottom portion of the preparatory hole by using the protective wall as an etching mask.

In this method, the protective wall is employed as an etching mask during the formation of the lower portion of the hole. Since the protective wall is formed at the inner wall of the preparatory hole, the etching mask ultimately achieves a shape whereby it extends out over the insulating layer. As a result, by adopting this structure, advantages similar to those achieved when increasing the film thickness of the etching mask are achieved. Consequently, the degree to which the etching mask pattern becomes receded at the hole upper portion is reduced to prevent an increase in diameter at the hole upper portion.

In addition, in the structure described above in which the vertical portions of the etching mask that overhang toward the hole upper portion are large, the vertical hole shape can be maintained even when the etching time is extended due to an increase in the film thickness of the insulating layer without having to increase the thickness of the etching mask. Thus, when forming the hole through etching, the hole diameter does not become increased or the etching does not stop at the middle area of the hole.

Furthermore, since the upper portion of the hole is formed in advance, the lower portion of the hole can be formed through etching in practically the same way as when forming a shallower hole having roughly the same diameter. Moreover, since the formation of the preparatory hole can be implemented with a higher degree of accuracy compared to the formation of the hole itself, due to factors related to the aspect ratio, the upper portion of the hole can be formed with a high degree of accuracy. As a result, the formation accuracy of the hole overall is improved to further prevent occurrence of defects in the hole shape.

It is to be noted that a structure in which the protective walls in the structure described above remain unremoved may be adopted instead. Since such a structure in which the protective walls are not removed requires fewer manufacturing steps and is less time consuming compared to the structure in which the protective walls are removed, the cost of manufacturing the semiconductor device can be reduced.

For the formation of the preparatory hole in this method, a structure may be adopted in which an etching stop layer for inhibiting the progress of the etching in the depthwise direction of the preparatory hole is formed at a specific depth of the insulating layer. In this structure, over-etching is prevented by the presence of the etching stop layer to achieve reliable control of the depth of the preparatory hole, i.e., the height at which the protective walls overhang toward the insulating layer.

In addition, the formation of the preparatory hole may be achieved through a step in which a first layer and a second layer are sequentially laminated on an insulation layer, a step in which an initial preparatory hole reaching the insulating layer via the first layer and the second layer is formed on a predetermined preparatory hole formation position and a step in which a preparatory hole is formed at the insulating layer by simultaneously etching the second layer and the bottom portion of the initial preparatory hole until the first layer becomes exposed.

In the process described above, based upon the state in which the second layer is ground off to expose the first layer, etching end-point detection is achieved at the second layer and the bottom portion of the initial preparatory hole. For instance, if a dry etching method is adopted to etch the second layer and the bottom portion in the initial preparatory hole, the emission spectrum of the plasma generated by the etching process can be changed at the first layer and at the second layer. Thus, it becomes possible to detect the etching end point so that good control can be achieved over the depth of the preparatory hole, i.e., the height at which the protective walls overhang toward the insulating layer through prevention of over-etching.

As explained above, the method for manufacturing a semiconductor device according to the present invention realizes a stable and inexpensive semiconductor process technology to contribute to further miniaturization and higher integration of the semiconductor device.

In addition, in order to achieve the object described above, in a second aspect of the present invention, a semiconductor device comprising a semiconductor substrate, an insulating layer laminated on the semiconductor substrate and a hole formed at the insulating layer adopts a structure in which the hole is constituted of a hole upper portion constituted of a large diameter portion reaching a specific depth of the insulating layer and a hole lower portion constituted of a small diameter portion having a smaller diameter than the large diameter portion and located further toward the semiconductor substrate than the large diameter portion. The semiconductor device having this structure may be achieved through, for instance, the method in the first aspect of the present invention.

As explained above, through any of the methods for manufacturing a semiconductor device according to the present invention, the degree to which the etching mask pattern is caused to recede can by minimized and a vertical hole shape can be maintained. In addition, since the upper portion of the hole is formed in advance in any of the methods for manufacturing a semiconductor device according to the present invention, the etching of the insulating layer which would tend to induce defects in the hole shape can be performed in much the same manner as when forming a hole having a lower aspect ratio than that of the actual hole being formed. Thus, the structure in the second aspect of the present invention can be achieved through a manufacturing method that enables simple and highly accurate hole formation. As a result, a semiconductor device that is inexpensive and achieves further miniaturization and higher integration is provided.

It is to be noted that in the semiconductor device according to the present invention described above, the etching stop layer may be constituted of silicon nitride and that the insulating layer may be constituted of BPSG.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

PREFERRED EMBODIMENTS OF THE INVENTION

The following is a detailed explanation of the preferred embodiments of the present invention in reference to the attached drawings. It is to be noted that the same reference numbers are assigned to components having the same functions and structural features in the following explanation and the attached drawings to preclude the necessity for repeated explanation thereof.

First Embodiment

First, the first embodiment is explained in reference to FIGS. 1~5. It is to be noted that FIGS. 1~5 mainly illustrate the steps taken in the method for manufacturing a semiconductor device in this embodiment.

The method for manufacturing a semiconductor device in the embodiment may be primarily divided into four steps, i.e., an element formation step, an insulating layer formation step, a mask formation step, and a contact hole formation step.

Figure 1:
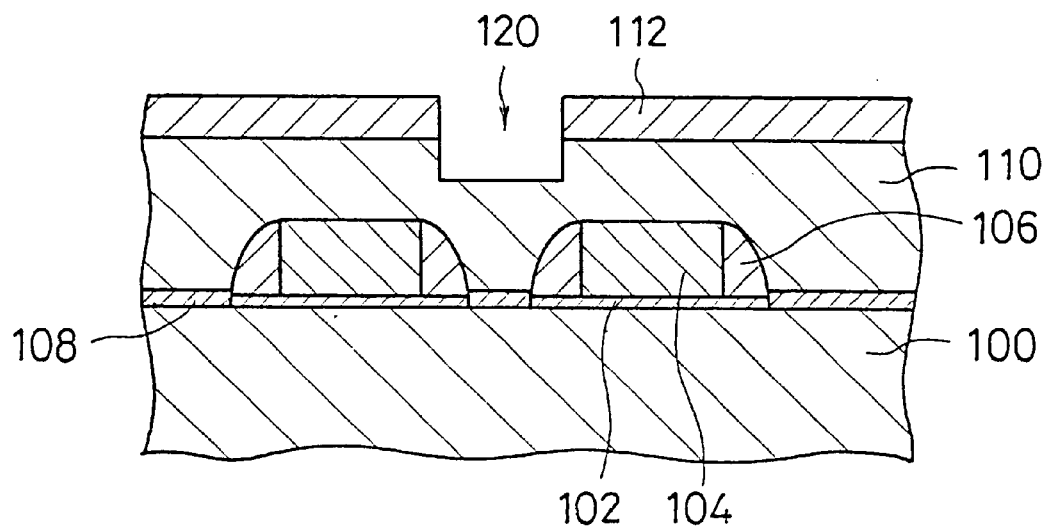
FIG. 1 is a schematic cross section illustrating a step in the method for manufacturing a semiconductor device in a first embodiment.

As illustrated in FIG. 1, during the element formation step, a specific element active area is first formed at a silicon substrate 100 which corresponds to the semiconductor substrate. Next, gate oxide film 102 is grown with a specific pattern at the front surface of the silicon substrate 100. Then, polysilicon gates 104 are grown on the gate oxide film 102 to form a gate pattern. Next, a CVD silicon oxide film 106 is grown at side walls of the polysilicon gates 104 to form a side wall spacer pattern. Then, a silicon oxide film 108 is formed at the exposed portion of the front surface of the silicon substrate 100 and by implanting impurity ions, a specific diffusion layer is formed at the silicon substrate 100 (the diffusion layer is not shown).

As shown in FIG. 1, during the insulating layer formation step, a BPSG film 110, which corresponds to the insulating layer is deposited over the entire surface of the silicon substrate 100 covering the polysilicon gates 104, the CVD oxide film 106 and the silicon oxide film 108. Next, the BPSG film 110 is planarized through hot flow. Then, a polysilicon film 112 is deposited. Following this, through the normal photolithography and dry etching processes, a pattern is formed at the polysilicon film 112 (the polysilicon pattern) which corresponds to the mask layer.

In addition, in this embodiment, concurrently with the formation of the pattern at the polysilicon film 112 or after the polysilicon pattern formation, the BPSG film 110 constituting the base is shaved to a specific depth. Such shaving may be implemented by employing, for instance, a polysilicon etching device operated at a high BPSG etching rate. Alternatively the shaving may be implemented by performing additional etching using an oxide film etching device after etching the polysilicon film 112. Consequently, a preparatory hole 120 constituting the preparatory hole or the large diameter portion is formed at the BPSG film 110.

Figure 2:
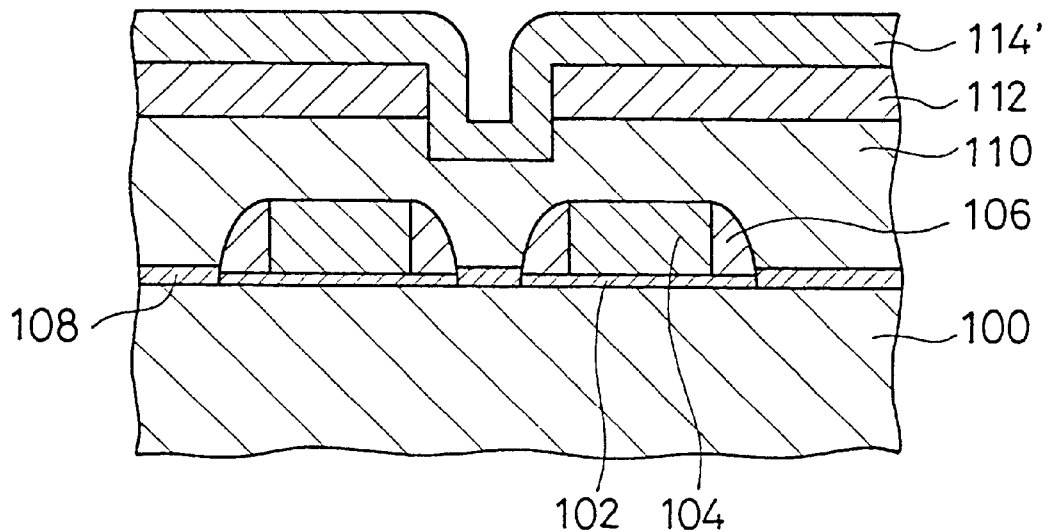
FIG. 2 is a schematic cross section illustrating a step in the method for manufacturing a semiconductor device in the first embodiment.
Figure 3:
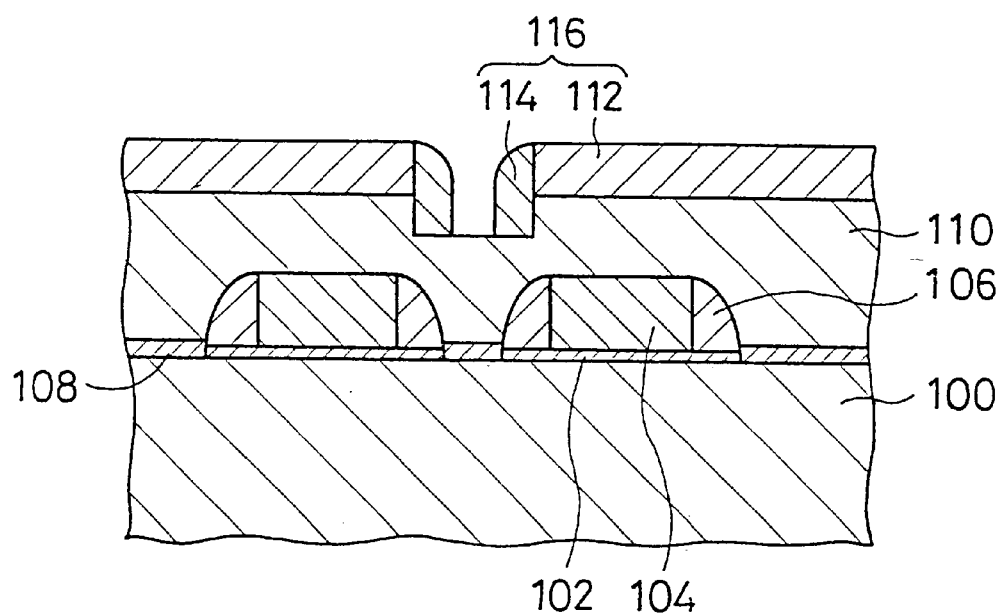
FIG. 3 is a schematic cross section illustrating a step in the method for manufacturing, a semiconductor device in the first embodiment.

Next, as illustrated in FIG. 2, a polysilicon film 114' is deposited to cover the pattern at the polysilicon film 112 during the mask formation step. Then, as illustrated in FIG. 3, etch-back is implemented over the entire surface so that only polysilicon side walls 114 corresponding to the protective walls remain at the side walls of the polysilicon film 112 to form a polysilicon side wall pattern. As a result, the pattern of a contact mask 116 for contact hole formation (contact mask pattern) is formed with the polysilicon film 112 and the polysilicon side walls 114.

Figure 4:
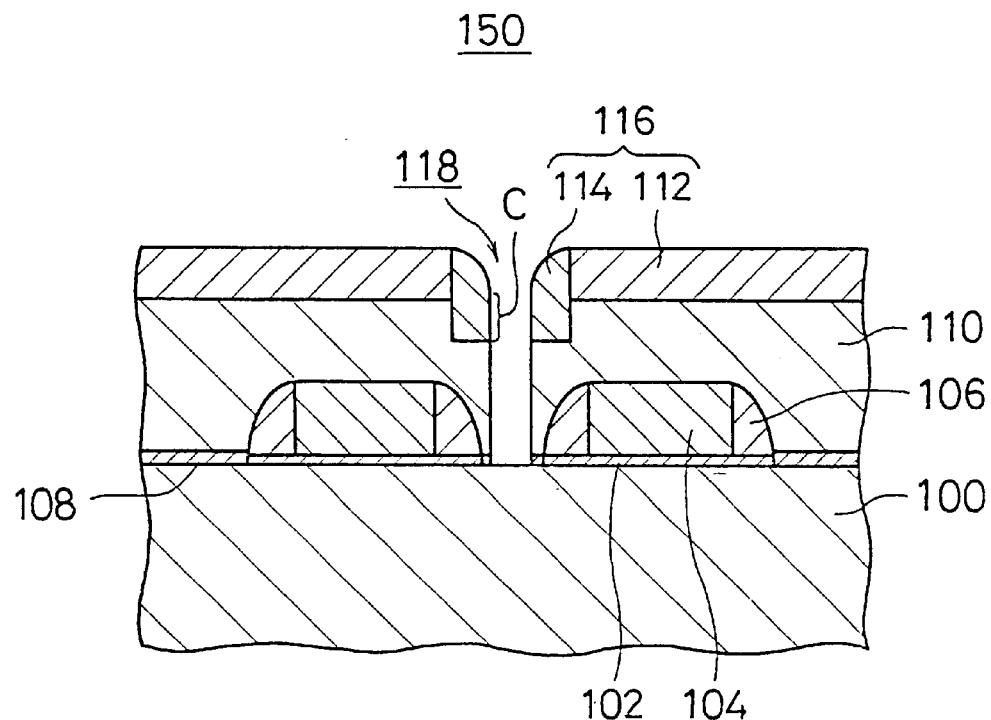
FIG. 4 is a schematic cross section illustrating a step in the method for manufacturing a semiconductor device in the first embodiment.

Then, as illustrated in FIG. 4, the BPSG film 110 is etched using the contact mask 116 as an etching mask and a pattern of contact holes 118 that constitutes holes (contact pattern) is formed during the contact hole formation step.

In this embodiment, in which the pattern at the polysilicon film 112 is formed by shaving the BPSG film 110 to a specific depth, larger vertical portions (portion C in FIG. 4) are formed at the polysilicon side walls 114 compared to methods for manufacturing a semiconductor device in the prior art. Consequently, the problem of an increased diameter at upper portion of the contact hole caused by the receding pattern does not occur when the polysilicon side walls 114 are etched. As a result, a semiconductor device 150 in the embodiment, the structural components of which are schematically illustrated in FIG. 4, is formed.

Figure 14:
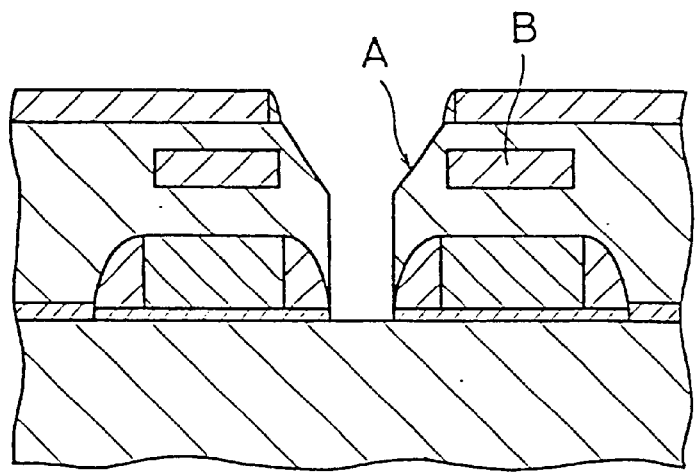
FIG. 14 illustrates other advantages achieved by the present invention.

As explained above, in the embodiment, larger vertical portions are achieved during the formation of the side wall pattern by shaving the BPSG film constituting the base, to a specific depth after dry etching the polysilicon. Thus, when the side wall portions are etched, the pattern is prevented from becoming receded to an excessive degree to ensure that the diameter of the contact hole upper portion does not increase. As a result, shorting is prevented from occurring between adjacent wiring layer patterns to minimize the occurrence of defects. It is to be noted that FIG. 14 illustrates a state in which, unlike in the embodiment, the diameter at the contact hole upper portion is increased by a receding pattern resulting from the etching of the side wall portions. FIG. 14 clearly illustrates that since the upper portion A of the contact hole is tapered to result in the side wall at the contact hole upper portion A approaching a wiring layer B, shorting will occur more readily between adjacent wiring layers.

Figure 15:
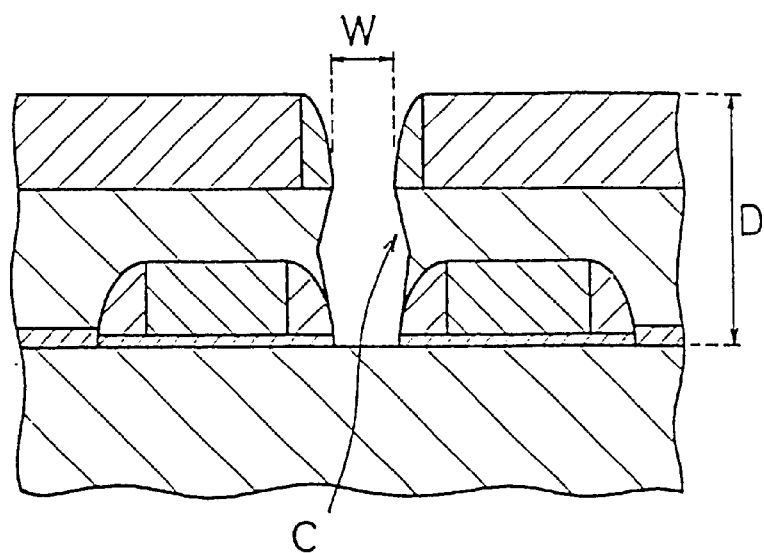
FIG. 15 illustrates other advantages achieved by the present invention.

In addition, since the vertical portions in the polysilicon side wall pattern are large in the embodiment, the contact hole will achieve a vertical shape without having to increase the film thickness of the polysilicon pattern even when the length of time required for etching during the contact hole formation increases due to an increase in the thickness of the insulating film. Thus, problems such as bowing (C in FIG. 15) whereby the diameter becomes larger at the middle area of the contact hole when the aspect ratio D/W is increased as illustrated in FIG. 15 and stoppage of etching at the middle area do not occur. Consequently, it becomes possible to provide a stable and inexpensive process employing the processing technology in the prior art.

Second Embodiment

Next, the second embodiment is explained mainly in reference to FIGS. 6~9.

Figure 6:
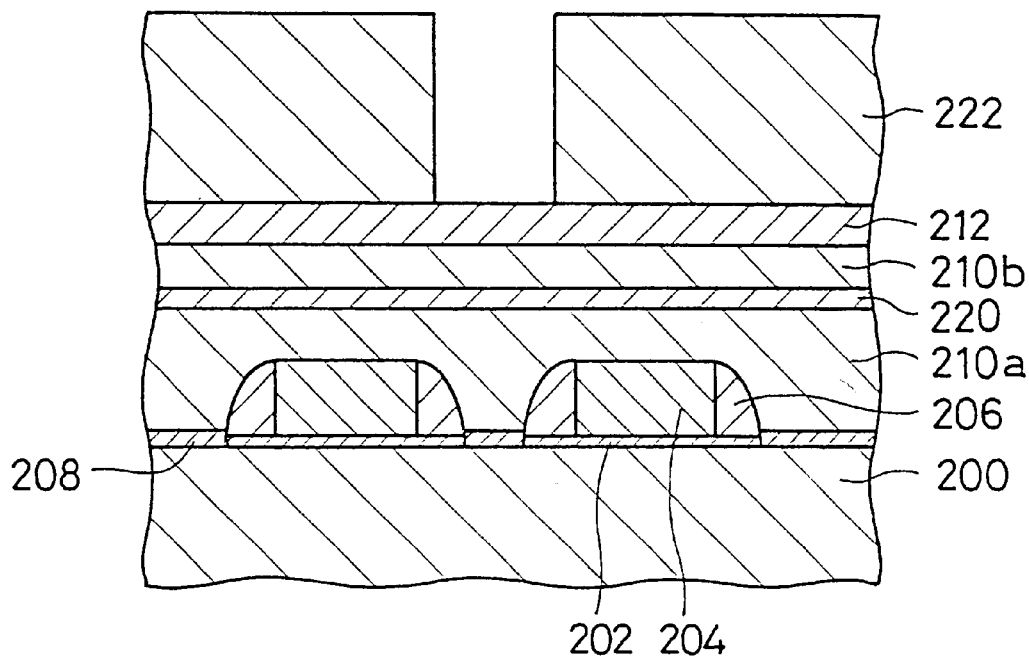
FIG. 6 is a schematic cross section illustrating a step in the method for manufacturing a semiconductor device in a second embodiment.

In the method for manufacturing a semiconductor device in this embodiment, first, element active areas are formed on a silicon substrate 200, silicon oxide film 202 is grown and a pattern of polysilicon gates 204 constituted of polysilicon is formed as illustrated in FIG. 6. Next, side wall spacers 206 are formed at side walls of the polysilicon gates 204 to form a side wall spacer pattern, then a silicon oxide film 208 is formed at exposed portions of the silicon substrate 200 and specific diffusion layers are formed at the silicon substrate 200 through impurity ion implantation (the diffusion layers are not shown).

Next, a first BPSG film 210a is deposited over the entire surface and is planarized through hot flow, and then a silicon nitride film 220, which corresponds to an etching stop layer is deposited. Then, a second BPSG film 210b is deposited and planarized through hot flow. After this, a polysilicon film 212 is deposited. Next, a pattern is formed at a resist film 222 through a conventional photolithography process and using the resist film pattern as an etching mask, the polysilicon film 212 is etched.

Figure 7:
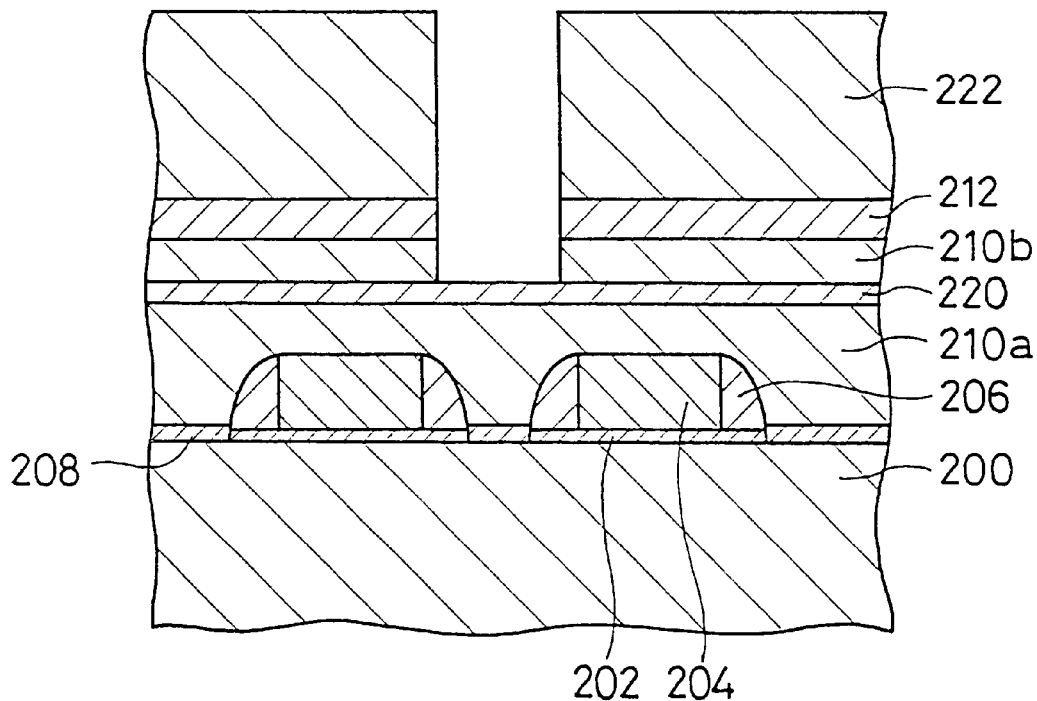
FIG. 7 is a schematic cross section illustrating a step in the method for manufacturing a semiconductor device in the second embodiment.

As illustrated in FIG. 7, in this embodiment, after the polysilicon film 212 is dry etched, the second BPSG film 210b constituting the base is etched under conditions whereby the etching rate of the BPSG is higher than the etching rate of the silicon nitride, until the silicon nitride film 220 becomes exposed.

Figure 8:
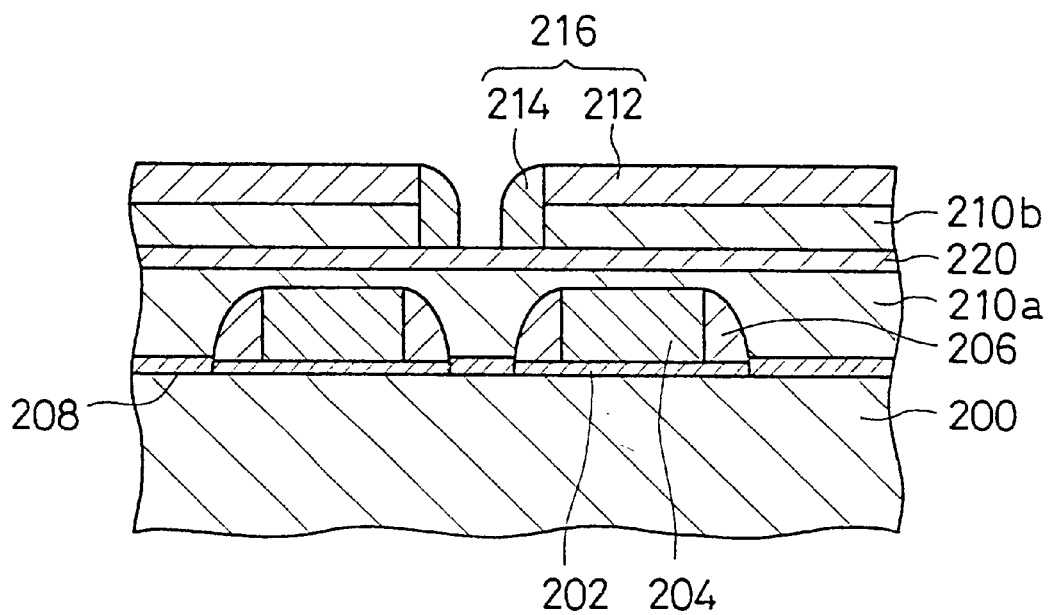
FIG. 8 is a schematic cross section illustrating a step in the method for manufacturing a semiconductor device in the second embodiment.

Then, as illustrated in FIG. 8, after removing the entire resist film 222, a polysilicon film is deposited and then by etching back the entire surface of this polysilicon film, polysilicon side walls 214 are formed at the side walls of the polysilicon film 212 to form a pattern for a contact mask 216.

Figure 9:
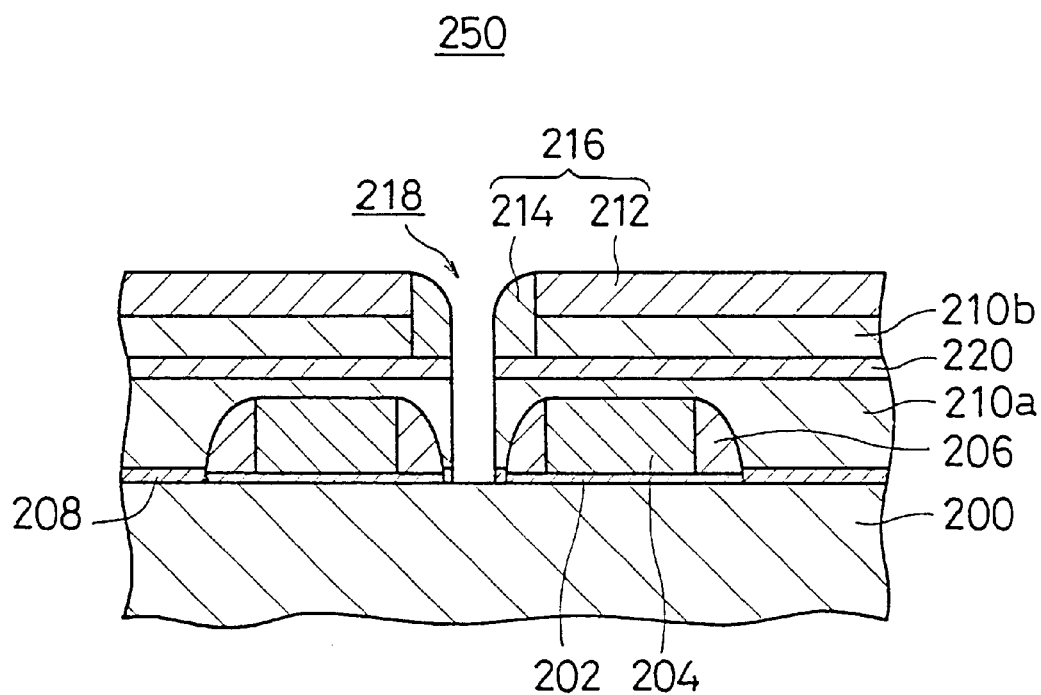
FIG. 9 is a schematic cross section illustrating a step in the method for manufacturing semiconductor device in the second embodiment.

Next, as illustrated in FIG. 9, using the contact mask 216 as an etching mask, the silicone nitride film 220 is first etched, and then the first BPSG film 210a is etched to form a pattern for the contact hole 218. As a result, a semiconductor device 250 in the embodiment, the structural components of which are schematically illustrated in FIG. 9, is formed.

As explained above, in this embodiment, in which the base BPSG film is shaved to a specific depth after dry etching the polysilicon, larger vertical portions are formed during the polysilicon side wall pattern formation as in the first embodiment described earlier to improve the control over the contact hole shape.

In addition, by adopting the embodiment, other problems can be eliminated as explained below.

Figure 5:
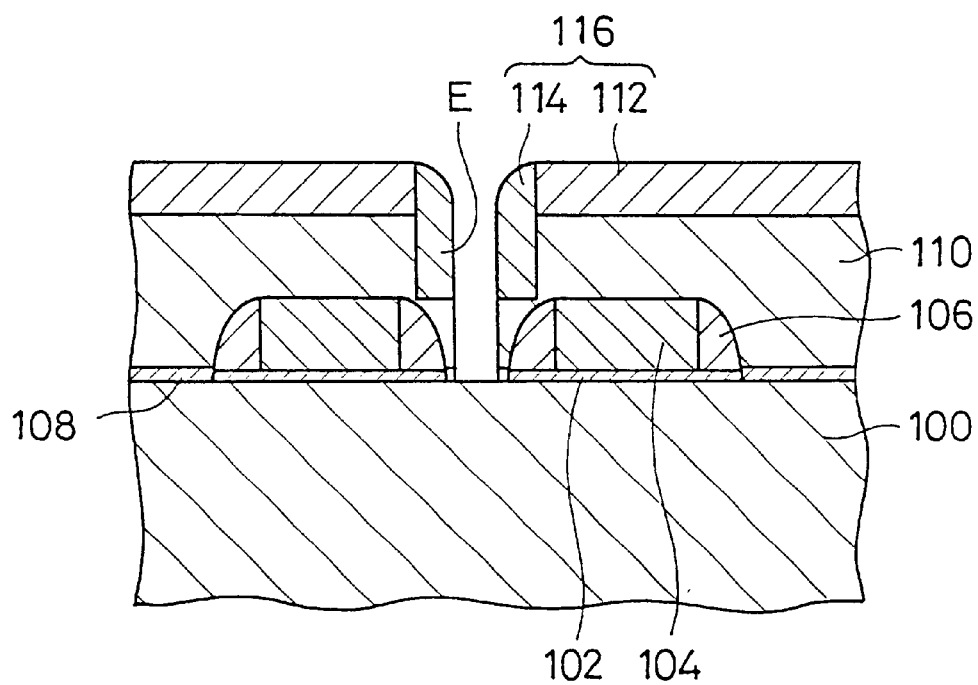
FIG. 5 illustrates the advantages achieved by the present invention.

First, other problems that may be eliminated through the embodiment are described. During the etching process, inconsistency in the etching rate is bound to occur within a given wafer and between wafers. While the etching time is set to shave the base BPSG by a specific quantity to achieve a stable contact hole shape, etching must be performed over (1+a) % of the target value with the inconsistency in the etching rate at ±a %. When etching is performed at (1+a) % relative to the target value, etching is performed to a depth of (1+a %)×(1+a %) relative to the target value in the area where the etching rate is at its highest. Thus, in order to control the base shaving quantity with a high degree of accuracy, the management of the film forming apparatus and the etching apparatus must be more precise and this will result in an increase m the apparatus management cost. In addition, when such a process is to be adopted on a semiconductor device having a thin BPSG film, sufficient margin cannot be assured between the gate pattern and the wiring pattern to be connected to the contact hole (portion E in FIG. 5) as illustrated in FIG. 5. Such insufficient margin between the patterns tends to induce shorting defects.

Now, the elimination of these problems through the embodiment is explained. In the embodiment which adopts a structure in which the silicon nitride film is formed under the second BPSG film, the etching stops above the silicon nitride film by implementing the etching process under conditions such that the etching rate of the BPSG is higher than the etching rate of the silicon nitride film, thereby achieving stable control of the quantity by which the base is shaved. Thus, the problem of shorting defects occurring between the gate pattern and the wiring pattern to be connected to the contact hole described above does not occur, and it becomes possible to provide a stable and inexpensive process employing the processing technology of the prior art.

Third Embodiment

Next, the third embodiment is explained in reference to FIGS. 10–13.

Figure 10:
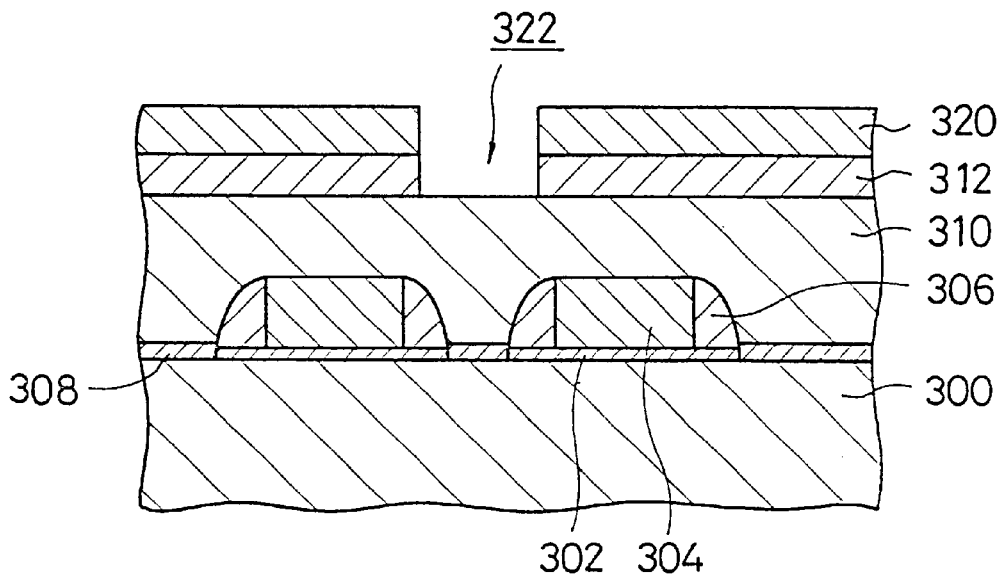
FIG. 10 is a schematic cross section illustrating a step in the method for manufacturing a semiconductor device in a third embodiment.
Figure 11:
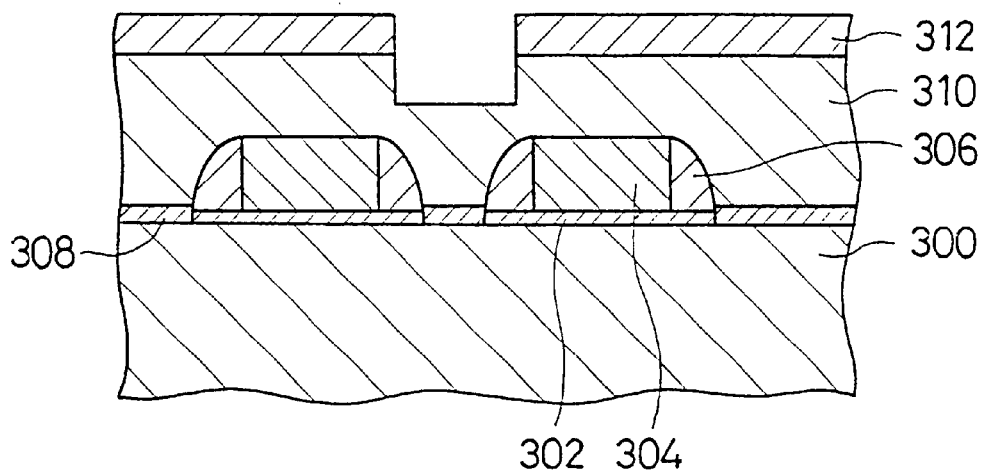
FIG. 11 is a schematic cross section illustrating a step in the method for manufacturing semiconductor device in the third embodiment.

In this embodiment, first, specific element active areas are formed on a silicon substrate 300, a gate oxide film 302 is grown and a pattern of polysilicon gates 304 constituted of polysilicon is formed as illustrated in FIG. 10. After forming side wall spacers 306 at the side walls of the polysilicon gates 304, a silicon oxide film 308 is formed at the exposed portion of the silicon substrate 300 and a specific diffusion layer is formed on the silicon substrate 300 through impurity ion implantation (the diffusion layer is not shown).

Next, a BPSG film 310 is deposited over the entire surface and is planarized through hot flow, and after this, a polysilicon film 312 to constitute a first layer and a silicon nitride film 320 to constitute a second layer are sequentially deposited. Then, through conventional photolithography and etching processes, a preparatory hole 322 which constitutes an initial preparatory hole is formed, thereby achieving a laminated pattern constituted of the polysilicon film 312 and the silicon nitride film 320.

Then, using the laminated pattern as an etching mask, the base BPSG film 310 is shaved through dry etching. During this process, the silicon nitride film 320 constituting the upper layer of the laminated pattern which functions as the etching mask is also etched. As a result, as the etching process progresses, the polysilicon film 312 constituting the base starts to become exposed. As the base polysilicon film 312 becomes exposed, the plasma emission spectrum changes greatly. For instance, by monitoring the CN emission (wavelength: 3862 angstroms), it is verified that the emission intensity becomes greatly reduced when the polysilicon film 312 constituting the lower layer becomes exposed.

By taking advantage of this phenomenon and by making the setting so that the etching operation ends when the emission intensity changes by a specific quantity, it becomes possible to detect the end point. When the end point detection is set through such a method, the shaving quantity for the BPSG film 310 can be controlled by setting the film thickness of the silicon nitride film 320 as follows.

Namely, with ER(B) representing the etching rate of the BPSG film 310, ER(N) representing the etching rate of the silicon nitride film 320 and D (B) representing the desired shaving quantity for the BPSG film 310, the film thickness T(N) of the silicon nitride film 320 should be set at;

$$T(N)=D(B)\times\{ER(N)/ER(B)\}$$

In other words, the film thickness T(N) of the silicon nitride film 320 should be increased to increase the shaving quantity of the BPSG film 310, whereas T(N) should be reduced to set a small shaving quantity for the BPSG film 310. In addition, generally speaking, in regard to inconsistency in the etching characteristics and changes occurring over time, the quantity of change in the etching rate ratio, e.g. ER (N)/ER (B), is smaller compared the degree to which the etching rates change. Consequently, by setting the film thickness of the silicon nitride film 320 as described above, the shaving quantity of the BPSG film 310 can be controlled in a stable manner.

Figure 12:
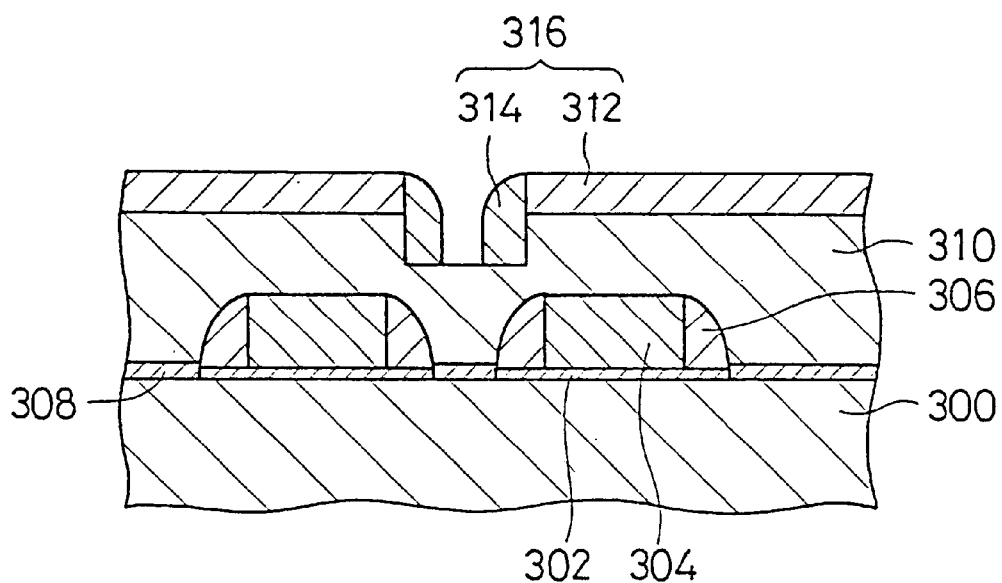
FIG. 12 is a schematic cross section illustrating a step in the method for manufacturing semiconductor device in the third embodiment.

Subsequently, as illustrated in FIG. 12, by depositing a polysilicon film and etching back the entire surface, polysilicon side walls 314 are formed at the side walls of the polysilicon film 312 to form a pattern of contact mask 316.

Figure 13:
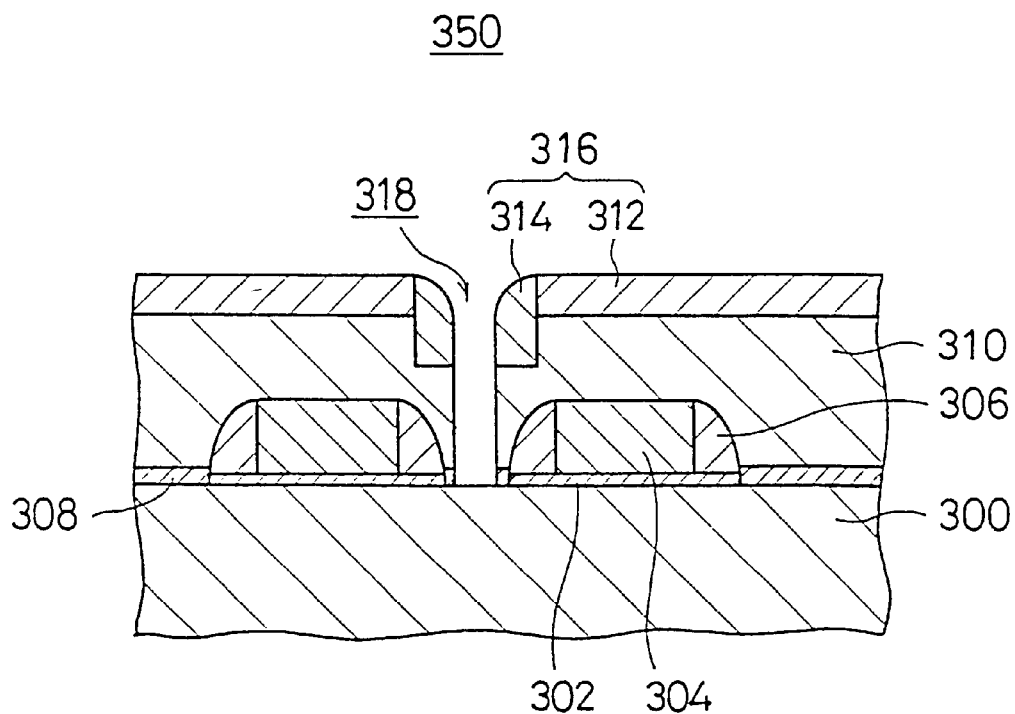
FIG. 13 is a schematic cross section illustrating a step in the method for manufacturing semiconductor device in the third embodiment.

Next, as illustrated in FIG. 13, using the contact mask 316 as an etching mask, the BPSG film 310 is etched to form a pattern for contact hole 318. As a result, a semiconductor device 350 in the embodiment is formed.

As explained above, in this embodiment, a pattern achieved by laminating a silicon nitride film and a polysilicon film is used as an etching mask, the silicon nitride film constituting the upper layer is concurrently etched while shaving the BPSG film and end point detection is achieved by monitoring the plasma emission intensity during this process, so that the shaving quantity of the BPSG film can be controlled with a high degree of stability. In other words, in the embodiment, as a means for stabilizing the base shaving quantity, the change in the plasma emission intensity occurring during the dry etching process is used to detect the etching end point and control the shaving quantity.

Thus, by adopting this embodiment, any inconsistency among wafers can be nullified by implementing the etching end point detection. Consequently, the likelihood of shorting occurring between the gate pattern and the wiring pattern to be connected to the contact hole is reduced. As a result, a stable and inexpensive process, employing the processing technology in the prior art, which is free of problems or defects, is provided.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while the semiconductor devices and the methods for manufacturing the semiconductor device employing a polysilicon film to constitute the etching mask are used as examples in the explanation of the preferred embodiments above, the present invention is not restricted to these structures. The present invention may be adopted in a semiconductor device and a method for manufacturing a semiconductor device employing an etching mask constituted of various other materials. According to the present invention, any film with a lower etching rate relative to that of the insulating layer can be used as an etching mask.

In addition, while examples of semiconductor devices and methods for manufacturing the semiconductor devices which employ an insulating layer assuming a three-layer structure comprising BPSG/nitride film/BPSG are used in the explanation of the embodiments above, the present invention is not restricted to these structures. The present invention may be adopted in a semiconductor device and a method for manufacturing the semiconductor device employing various other insulating layers. According to the present invention, the insulating layer may assume a two-layer structure or a structure having four layers or more as long as another layer with a lower etching rate is formed immediately below the uppermost layer.

Furthermore, the materials used in the embodiments only represent examples, and the present invention is not restricted to these structures. For instance, while the embodiments are explained in reference to the method for manufacturing a semiconductor device using an etching mask constituted of a laminated pattern comprising a silicon nitride film (constitutes the second layer) and a polysilicon film (constitutes the first layer), the present invention is not restricted to these structures. The present invention may be adopted in a method for manufacturing a semiconductor device employing an etching mask constituted of various other laminated patterns. The present invention does not impose any restriction whatsoever upon materials as long as it is ensured that the etching rate of the upper layer of the laminated pattern is higher than the etching rate of the lower layer of the laminated pattern under the etching conditions set for shaving the insulating layer. Likewise, it is obvious that other components may be constituted of materials other than those used as an example in the embodiments explained above.

Moreover, while the embodiments are explained by using methods for manufacturing a semiconductor device which achieve planarization of the insulating layer through hot flow, as examples, the present invention is not restricted to these structures. The present invention may be adopted in methods for manufacturing a semiconductor device that employ various other methods for planarization such as coating, bias sputtering, reflow, etch-back and lift-off.

In addition, while the embodiments are explained by using methods for manufacturing a semiconductor device in which the protective walls are formed through an etch-back as examples, the present invention is not restricted to these structures. The present invention may be adopted in methods for manufacturing a semiconductor device in which the protective walls are formed through various other methods such as crystal epitaxy methods including the CVD method, the MBE (molecular beam epitaxy) method.

Furthermore, while the embodiments above are explained by using methods for manufacturing a semiconductor device and semiconductor devices in which the electrical elements are constituted of unipolar transistors as examples, the present invention is not restricted to these structures. The present invention may be adopted in methods for manufacturing a semiconductor device and in semiconductor devices employing various other electrical elements such as bipolar transistors and capacitances.

Moreover, while the embodiments above are explained by using methods for manufacturing a semiconductor device and semiconductor devices in which contact holes are formed as holes as examples, the present invention is not restricted to these structures. The present invention may be adopted in methods for manufacturing a semiconductor device and in semiconductor devices having various other holes, e.g., holes that are formed for purposes other than power supply.

According to the present invention, shape defects in contact holes and the like can be prevented and electrical defects such as shorting can be reduced in a semiconductor device. Thus, a semiconductor processing technology that is stable and inexpensive can be achieved to contribute to further miniaturization and higher integration of a semiconductor device and to cost reduction achieved through an improvement in yield.

The entire disclosure of Japanese Patent Application No. 10-282371 filed on Oct. 5, 1998 including specification, claims drawings and summary is incorporated herein by reference in its entirety.

What is claimed is:

1. A method for manufacturing a semiconductor device that includes a hole formation process for forming a hole in an insulating layer laminated on a semiconductor substrate, said hole formation process comprising:

forming a preparatory hole having a larger diameter than said hole, said preparatory hole reaches to a specific depth of said insulating layer and is formed at a formation position of said hole at said insulating layer;

forming a protective wall having a specific thickness at an inner wall of said preparatory hole, the protective wall being an upper portion of said hole; and forming a lower portion of said hole as having a smaller diameter than said preparatory hole, said lower portion being formed at a bottom portion of said preparatory hole by using said protective wall as an etching mask.

2. The method for manufacturing a semiconductor device according to claim 1, wherein said protective wall is left unremoved.

3. The method for manufacturing a semiconductor device according to claim 1, further comprising forming an etching stop layer that stops etching of said preparatory hole in a depthwise direction at said specific depth of said insulating layer.

4. A method for manufacturing a semiconductor device that includes a contact hole formation process for forming a contact hole in an insulating layer laminated on a semiconductor substrate, comprising:

forming a first mask layer which is patterned, over said insulating layer;

etching said insulating layer to form a preparatory hole in said insulating layer by using said first mask layer as an etching mask, said preparatory hole having a larger diameter than said contact hole and reaching to a specific depth of said insulating layer;

forming a second mask layer over said insulating layer and in said preparatory hole;

etching said second mask layer to form a protective wall which has a specific thickness at an inner wall of said preparatory hole; and etching said insulating layer by using said first mask layer and said protective wall as an etching mask, wherein said contact hole which has a smaller diameter than said preparatory hole is formed through said insulating layer from a bottom portion of said preparatory hole to a surface of said semiconductor substrate.

5. The method for manufacturing a semiconductor device according to claim 4, wherein said first mask layer and said second mask layer are a same material.

6. The method for manufacturing a semiconductor device according to claim 4, wherein said first mask layer and said second mask layer are conductive material.

7. The method for manufacturing a semiconductor device according to claim 4, wherein said protective wall is left unremoved.

8. The method for manufacturing a semiconductor device according to claim 4, further comprising forming an etching stop layer that stops etching of said preparatory hole in a depthwise direction at said specific depth of said insulating layer.

9. A method of forming a contact hole in an insulating layer laminated on a semiconductor substrate, comprising:

laminating first and second layers sequentially on the insulating layer;

forming a preparatory hole through the second layer to expose the first layer;

forming a protective wall along inner sidewall surfaces of the preparatory hole, the protective wall being an upper sidewall of the contact hole; and forming a lower portion of the contact hole that exposes the semiconductor substrate, by etching through the first layer and the insulating layer using the second layer and the protective wall as an etching mask.

10. The method of forming a contact hole of claim 9, wherein the preparatory hole has a diameter that is greater than a diameter of the contact hole.

11. The method of forming a contact hole of claim 9, wherein said forming a preparatory hole comprises etching the second layer using the first layer as an etch stop layer.

12. The method of forming a contact hole of claim 9, wherein the protective wall is not removed.

* * * * *